United States Patent [19]
Zvonar et al.

[11] Patent Number: 5,828,989
[45] Date of Patent: Oct. 27, 1998

[54] SEMICONDUCTOR MANUFACTURING SYSTEM HAVING A BAR-CODE INTERFACE

[75] Inventors: John G. Zvonar; Gerald W. Barnett, both of Austin, Tex.

[73] Assignee: Advanced Micro Devices, Inc., Sunnyvale, Calif.

[21] Appl. No.: 787,074

[22] Filed: Jan. 22, 1997

[51] Int. Cl.$^6$ .................................................. G06F 19/00
[52] U.S. Cl. .............. 702/188; 364/468.22; 364/468.23; 364/468.28
[58] Field of Search ......................... 364/551.01, 468.22, 364/468.23, 468.28, 478.03, 478.09, 478.12, 478.13, 478.14, 478.15, 478.1; 702/188

[56] References Cited

U.S. PATENT DOCUMENTS

| | | | |
|---|---|---|---|
| 4,930,086 | 5/1990 | Fukasawa ................................. | 364/468 |
| 5,325,582 | 7/1994 | Glaser et al. ............................ | 364/468 |
| 5,375,061 | 12/1994 | Hara et al. .............................. | 364/468 |
| 5,432,702 | 7/1995 | Barnett ................................... | 364/468 |
| 5,434,790 | 7/1995 | Saka et al. .............................. | 364/468 |

OTHER PUBLICATIONS

Master® Bar Code Multi-Interface Controllers User Manual, Copyright Feb. 1993: pp. A–H thru 1–92.
Percon Series 10 Complete Parameter Listing and Bar Codes, May 20, 1992, no pg. #'s.
Master® Bar Code Multi-Interface Controller; Quick and Simplified Activation of the Keyboard Wedge Mode; no pg. #'s date unknown.
Opticon, "MR–1100 Hand–Held CCD Scanner with 3" DOF, PP. 1–2 date unknown.
Santa Clara Plastics, "Model 3152–1400A Sub–Ambient System", Nov. 21, 1988, pp. 1–1 thru 10–9.

*Primary Examiner*—John Barlow
*Assistant Examiner*—Patrick Assouad
*Attorney, Agent, or Firm*—Skjerven, Morrill, MacPherson, Franklin & Friel, L.L.P.; Stephen A. Terrile

[57] ABSTRACT

A process run card encoded with bar-code information and providing controllers with scanners which can scan the bar-code information and configure the controller accordingly is disclosed. Such a system advantageously provides a semiconductor manufacturing system controller which minimizes or reduces the problems associated with having to reprogram controllers for various lots. Such a system also provides a mechanism for preventing the erroneous re-processing of semiconductor material which has already received a timed processing step.

12 Claims, 11 Drawing Sheets

SEMICONDUCTOR MANUFACTURING SYSTEM HAVING A BAR-CODE INTERFACE

BACKGROUND OF THE INVENTION

1. Field of the Invention

The present invention relates to semiconductor wafer processing and cleaning operations, and more particularly, to operating timed semiconductor manufacturing operations.

2. Description of the Relevant Art

It is known to provide a semiconductor manufacturing system with controllers which control various processing steps within the semiconductor manufacturing system. For example, a controller may be used to control the operation of a sink containing fluid to set variables such as the temperature of the fluid in the sink and the time that a semiconductor material is to be dipped in the fluid.

Accidental failure to set the correct time on a controller can result in an incorrect processing step for the material being processed. The consequence of an incorrect processing step is often that the material processed must be scrapped. In the normal operation of a timed semiconductor manufacturing controller, a human operator must manually set the controller timer to the value indicated for the process. In practice, the controller typically remains set at the most common process time. This practice results in material being processed for longer or shorter than necessary. Depending upon the step actually being performed by the controller, this can render the semiconductor material unusable thus reducing the efficiency of the semiconductor fabrication system.

The processing that is to be performed on a lot of semiconductor material is normally represented in a card containing a "recipe" of steps to be taken on that lot of semiconductor material. Different lots of semiconductor material will often be processed with different recipes and different tools during the various steps of the wafer fabrication process. Particular steps of the semiconductor processing system will often process various lots interchangeably. Accordingly, it is often necessary to reset the controller to adjust for the various lots.

SUMMARY OF THE INVENTION

It has been discovered that providing a process run card encoded with bar-code information and providing controllers with scanners which can scan the bar-code information and configure the controller accordingly, advantageously provides a semiconductor manufacturing system controller which minimizes or reduces the problems associated with having to reprogram controllers for various lots. Such a system also provides a mechanism for preventing the erroneous re-processing of semiconductor material which has already received a timed processing step.

More specifically, the invention relates to a controller which is dedicated to the timer on a particular semiconductor manufacturing controller. Data representing commands to the controller, process times, and unique lot identifiers are encoded in bar-code format. Each lot of material has a runcard containing said bar-code formatted data associated with it. The controller has a bar-code scanner attached to it, which scans the bar-code(s) associated with the lot of material for a given timed step in the processing. The controller then uses this information to operate the timer on the semiconductor manufacturing controller.

DETAILED DESCRIPTION OF A PREFERRED EMBODIMENT

Figure 1:
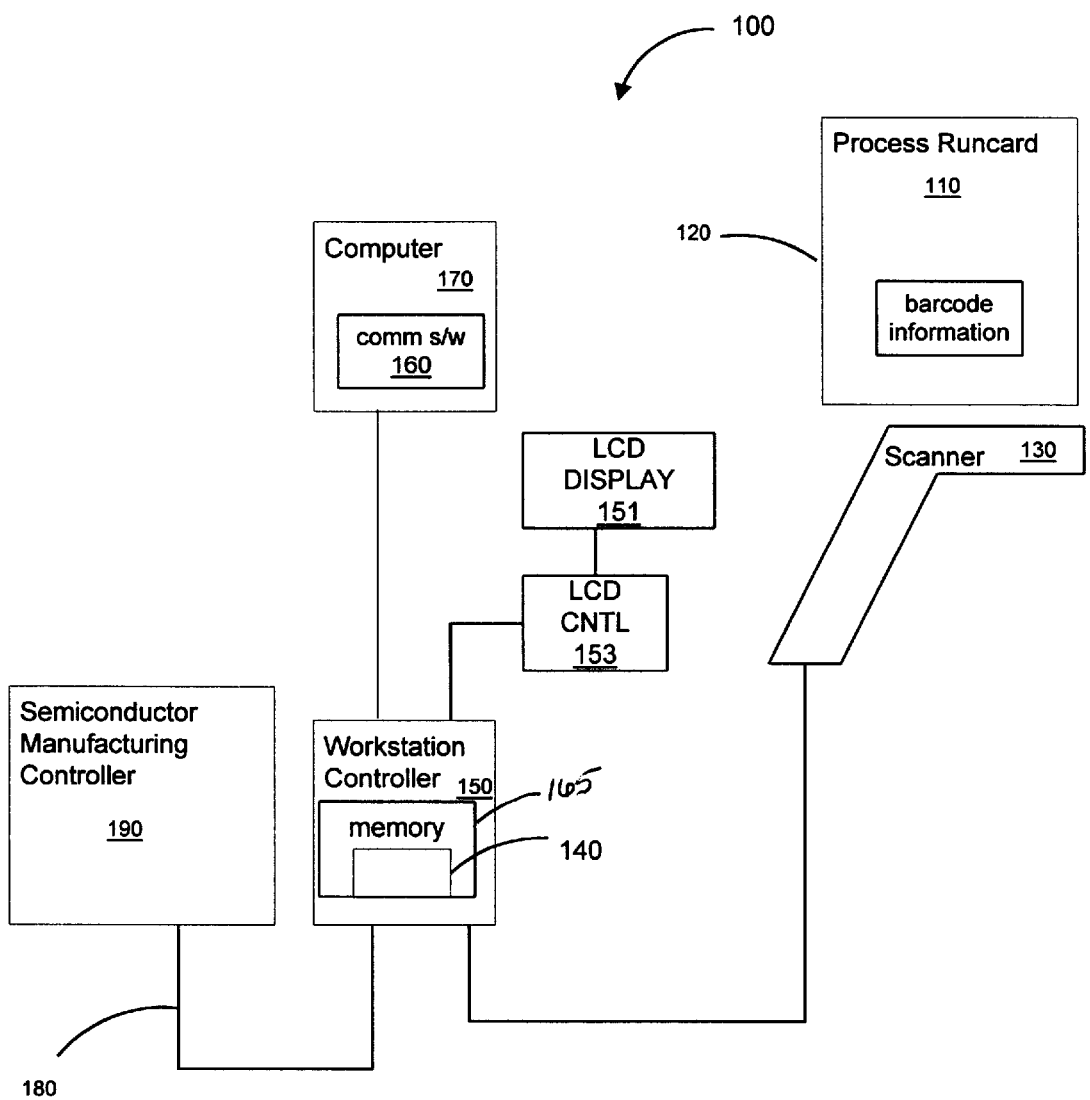
FIG. 1 is a diagrammatic block diagram of a semiconductor manufacturing controller system in accordance with the present invention.

Referring to FIG. 1, semiconductor manufacturing controller system 100 includes workstation controller 150, which is, for example, available from Blue Earth Research under the trade designation Micro-440. Workstation controller 150 is coupled to timed semiconductor manufacturing controller 190 via interface 180. Semiconductor manufacturing controller 190 is available, for example, from Santa Clara Plastics under the trade designation SCP 3152 Subambient Temperature Controller. Interface 180 conforms to, for example, a subset of the Semiconductor Equipment Communication Standard (SECS-2). It will be appreciated that interface 180 could conform to any fixed functional protocol. Workstation controller 150 is also coupled to bar-code scanner 130, which, for example, is available from Opticon, under the trade designation Opticon Bar-code Scanner. Workstation controller 150 may also be coupled to operator display 151 via LCD controller 153. Display 151 provides information regarding the status of workstation controller 150. Operator display 151 is an LCD display, the operation and control of which is well known in the art.

Workstation controller 150 is also coupled to computer 170, which is for example a standard IBM compatible personal computer. Communications software 160, which operates within computer 170 allows a user to download controller operating system 140 to the Workstation Controller 150, where it is stored in within non-volatile memory 165. When the controller operating system 140 is downloaded to the workstation controller 150, the operation of workstation controller 150 does not require computer 170.

During normal operation, the manufacturing controller system 100 is configured to operate in the mode most suitable for the operation being performed. The desired mode is selected by bar-code reading of a mode select card. Once the mode has been established, the manufacturing controller system 100 continues to operate in that mode until the mode select card is scanned to change the mode. The mode select card includes, for example, bar code representations of lot list, no lot and watch modes.

Once the operating mode has been established, the process runcard 110 interacts with the manufacturing controller system 100. Process runcard 110 includes bar-code information 120, which may include a time value specifying the duration of processing for a lot of material, or a time value specifying the duration of processing a lot of material along with an identifier which uniquely identifies the specific tank to be used for the process. Process runcard 110 also may include a second bar-code which uniquely identifies a particular lot of semiconductor processing material.

The process runcard 110 is associated with a lot of semiconductor material upon which a timed process step is to be performed by a timed semiconductor manufacturing controller such as the SCP 3152 dip tank. Examples of timed operations include etching of semiconductor material with acid, and washing the etched semiconductors with de-ionized water after etching. To perform these operations, the bar-code information 120 is scanned from the process runcard 10 by the scanner 130, and transmitted to the workstation controller 150. The workstation controller software 140 reads the scanned data, and responds according to the information encoded therein.

An operator scans the bar-code information representing the duration of the timed processing step for the corresponding lot of semiconductor material from the runcard 110 with the bar-code scanner 130. The bar-code information is transmitted to the Blue Earth Micro-440 controller 150. Computer readable program code on the Blue Earth Micro-440 controller 150 reads the data, and sets the time on the timer. Controller 150 then monitors the timer to verify that the process is actually started.

The semiconductor manufacturing controller system 100 reads the dip times directly from the runcard 110 for processing the semiconductor material. Therefore, dip times are added directly to the runcard 110. The dip time is a combination of an indicator of the units of time, and the actual units, also optionally including an identifier which uniquely identifies the specific tank to be used for the process. A typical dip time of 120 seconds is specified in bar-code 120 as S120, the S indicating seconds. Alternately, the same dip time could be specified as M2, M02.0 or M020, to indicate a dip time of 2 minutes. In addition, in another embodiment, the same dip time could be expressed as B S120, N S120, etc., where the first character uniquely identifies the specific tank to be used for the process.

Figure 2:
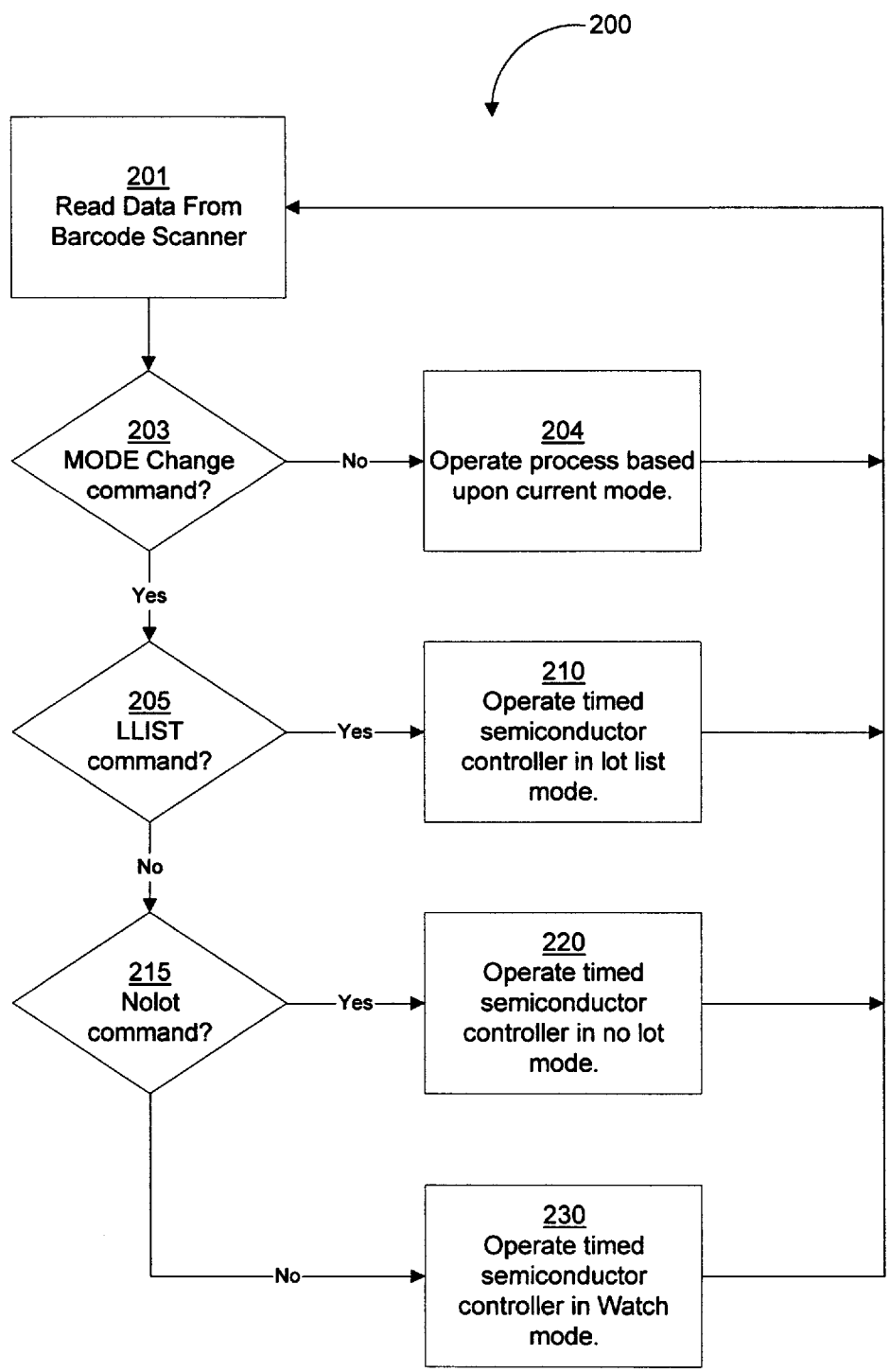
FIG. 2 is a diagrammatic block diagram of the high level overview of the semiconductor manufacturing controller of FIG. 1 in operation.

Referring now to FIG. 2, the semiconductor workstation controller 150 includes several modes of operation. The modes of operation of the semiconductor manufacturing workstation controller 150 include a lot list mode of operation 210, a no lot mode of operation 220, and a watch mode of operation 230. More specifically, the watch mode of operation 230 allows normal operation of controller 150 but ensures that old times are not reused and that entered times are used within a short interval, thus preventing mindless reuse of old times. The no lot mode of operation is like the watch mode but each timer is set by reading a bar code of a runcard, thus ensuring the right time for processing. The lot list mode includes the functions of the no lot mode and additionally associates a dip time with a lot of material, thus preventing accidental reprocessing of a lot of material.

The mode of operation of semiconductor manufacturing controller system 150 is determined by a mode bar-code command. More specifically, operation of the semiconductor manufacturing controller system 150 starts with read bar code scanner step 201. During read bar code scanner step 201, the workstation controller 140 monitors the bar code scanner 130 to determine whether bar code scanner 130 has read a bar code as indicated by bar code scanner transmitting the bar code information to workstation 140. When workstation 140 receives bar code information from bar code scanner 130, control transitions to decision step 203. During decision step 203, the bar code information is read to determine if it contains a mode change command. If a mode change command has not been issued, then control transitions to operate process step 204, workstation controller operates based upon the last selected mode of operation, i.e., the current mode of operation. If the bar code information indicates that a mode change command has been received, then control transitions to lot list command decision step 205. The mode of operation is the lot list mode of operation then control transitions to lot list mode step 210. During lot list mode step 210, the current mode of operation is updated and controller 150 operates in the lot list mode of operation. On completion of the lot list mode step 210, control transitions to read bar code step 201 during which scanner 130 is monitored to determine whether a new command information is received.

If, during decision step 205, the bar code information indicates that the mode of operation is not a lot list mode command then control transitions to decision step 215. During decision step 215, workstation controller 150 determines whether bar code information indicates that the mode of operation is the no lot mode of operation. If the bar code information indicates that the mode of operation is the no lot mode of operation, then control transitions to no lot mode step 220. During no lot mode step 220, the current mode of operation is updated and workstation controller 150 operates in the no lot mode of operation. On completion of the no lot mode step 220, control transitions to read bar code step 201.

If, during decision step 215, the bar code information indicates that the mode of operation is not a no lot mode command, then control transitions to watch mode step 230. During watch mode step 230, the current mode of operation is updated and workstation controller 150 operates in the watch mode of operation. On completion of the watch mode step 230, control transitions to read bar code step 201.

Figure 3:
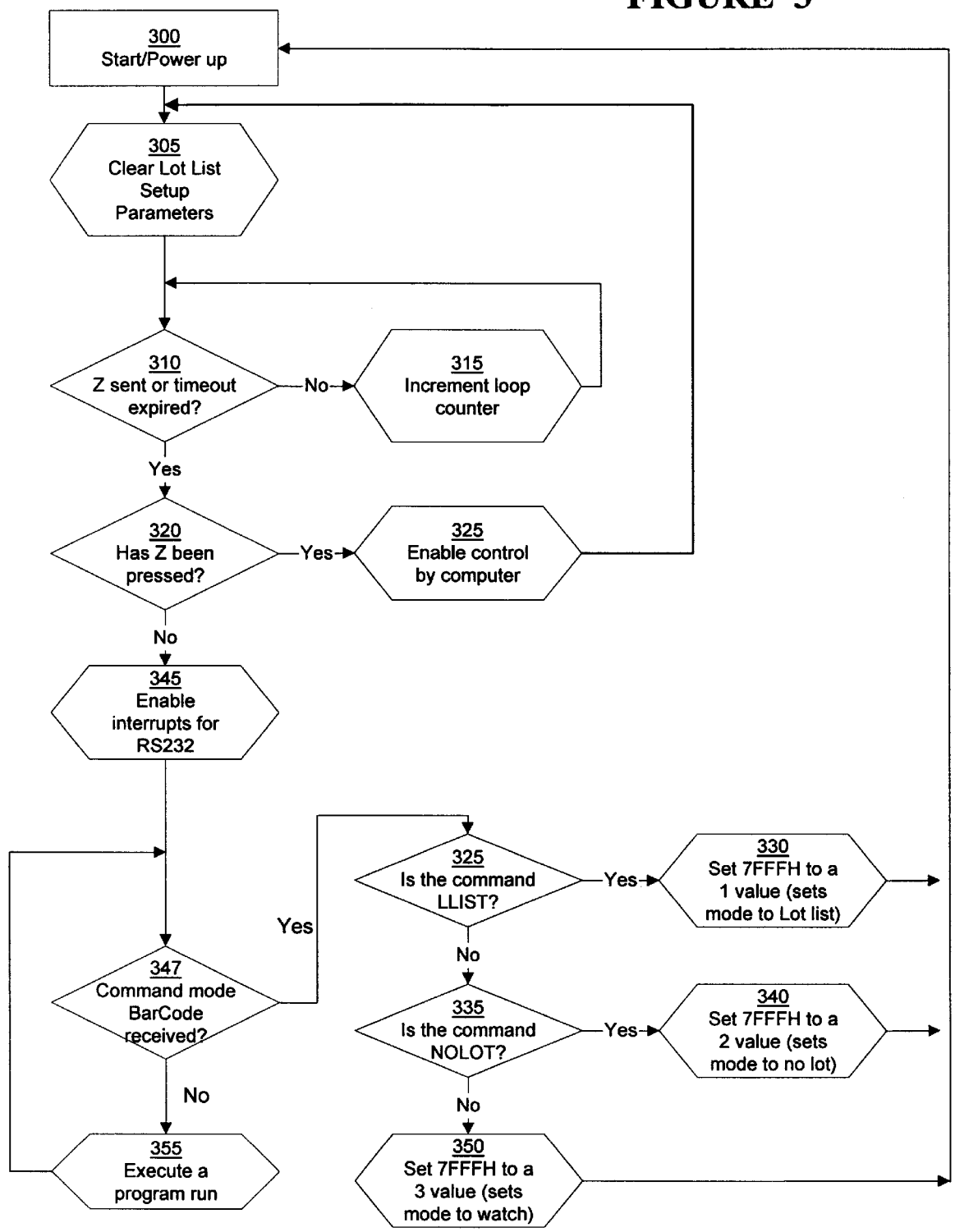
FIG. 3 is a flow chart of a command loop of the semiconductor manufacturing controller system of FIG. 1.

Referring to FIG. 3, the interaction between workstation controller operating system 140 and a register portion (not shown) of workstation controller 150 is set forth. More specifically, a processing step starts at processing start step 300. Control then transitions to initialization step 305. During initialization step 305, semiconductor manufacturing controller operating system 140 clears any the lot list setup parameters that may be resident within a register portion of workstation controller 150. Upon completion of initialization step 305, control transitions to decision step 310. During decision step 310, semiconductor manufacturing controller operating system 140 determines whether an operator has pressed a Z key on a keyboard to interrupt the operation of the processing step. Decision step 310 also determines whether a loop counter has reached a predetermined count, thus indicating that the processing step is complete. If the processing step not completed and Z key has not been pressed, then control transitions to increment counter step 315. During increment counter step 315, controller operating system 140 increments the loop counter, and returns to decision step 310. When the loop counter reaches the predetermined count, or Z key has been pressed, control transitions to decision step 320. During decision step 320, controller operating system 140 determines whether the Z key has been pressed.

If the Z key has been pressed, then control transitions to enable control by computer 170 at step 325. During enable control step 325, computer 170 downloads a new controller operating system 140 to workstation controller 150. After the new operating system is downloaded, control transitions to initialization step 305.

If the Z key has not been pressed, then control transitions to enable interrupt step 345. During enable interrupt step 345, controller operating system 140 enables the interrupts of workstation controller 150, thereby enabling interaction between workstation controller 150 and manufacturing controller 190. Control then transitions to command mode bar code received decision step 347. During decision step 347, controller 150 determines whether a command mode bar-code signal is received. If a command mode bar-code signal is not received, then control transitions to execute program step 355. During execute program step 355 controller operating system 140 causes workstation controller 150 to operate in the mode of operation that was most recently used.

If, during decision step 320, a command mode bar-code signal is received, then control transitions to lot list decision step 325. During decision step 325, controller operating system 140 determines whether the command mode bar-code signal is a LLIST (lot list) command. If the command indicated is a LLIST command, then control transitions to processing step 330. During processing step 330, controller operating system 140 sets a register corresponding to address 7FFFH to a value of 1, thus indicating that the timed semiconductor controller system 190 should be operated in lot list mode. From processing step 330, controller operating system 140 transitions initialization step 305.

If, during decision step 325, controller 150 determines that the command is not a lot list command, then control transitions to decision step 335. During decision step 335, controller operating system 140 determines whether the bar-code signal indicates is a NOLOT (no lot) command. If the bar-code signal indicates is the no lot command, then control transitions pressing step 340. During processing step 340, controller operating system 140 sets a register corresponding to address 7FFFH to a value of 2, thus indicating that the timed semiconductor controller system 190 should be operated in a no lot mode of operation. From processing step 340, controller operating system 140 transitions to initialization step 305

If, during decision step 335, the controller 150 determines that the bar-code signal is not a no lot command, then control transitions to processing step 350. During processing step 340, controller operating system 140 sets a register corresponding to address 7FFFH to a value of 3, thus indicating that the timed semiconductor controller system 190 should be operated in a watch mode of operation. From processing step 350, controller operating system 140 transitions to initialization step 305.

Figure 4A:
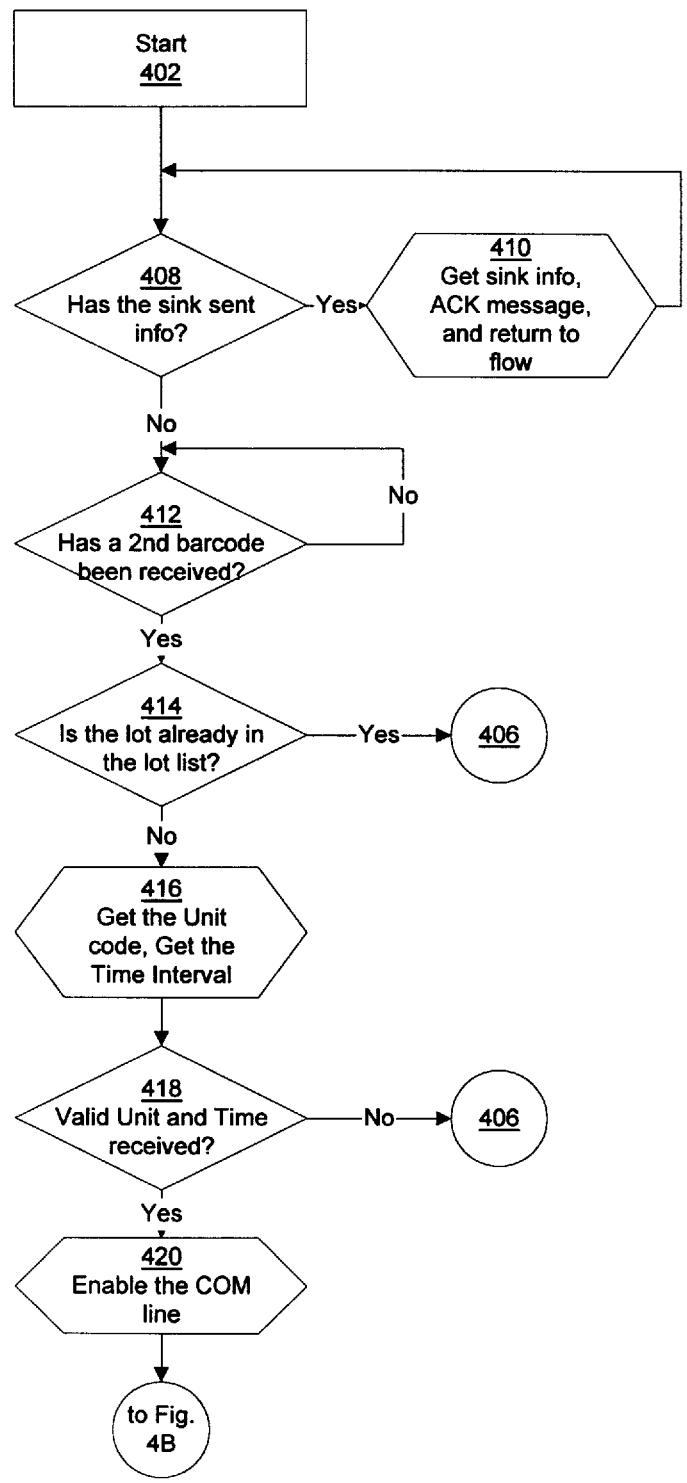
FIGS. 4A–4C are flow charts showing the operation of the manufacturing controller system of FIG. 1 while in a lot list mode of operation.
Figure 4B:
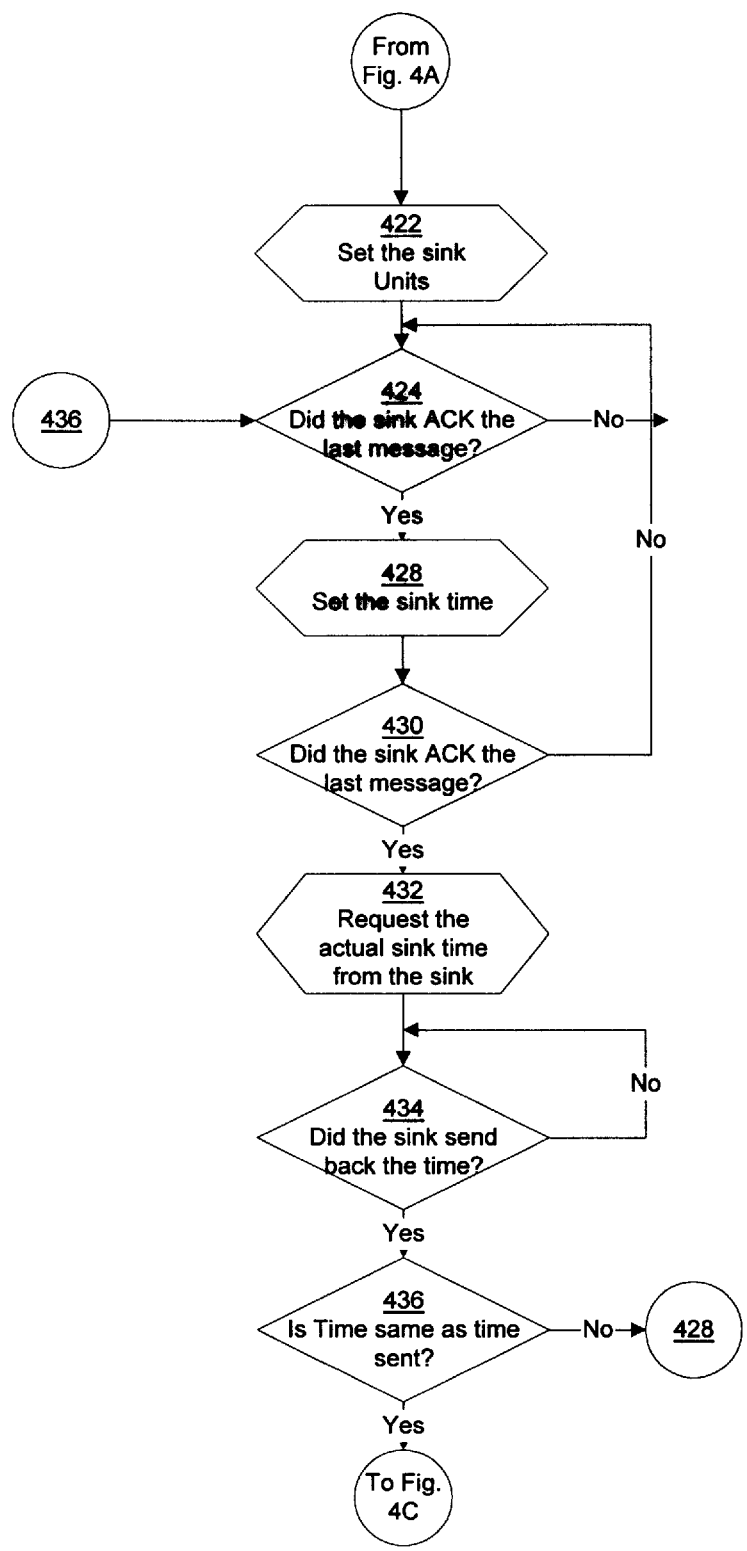
Figure 4C:
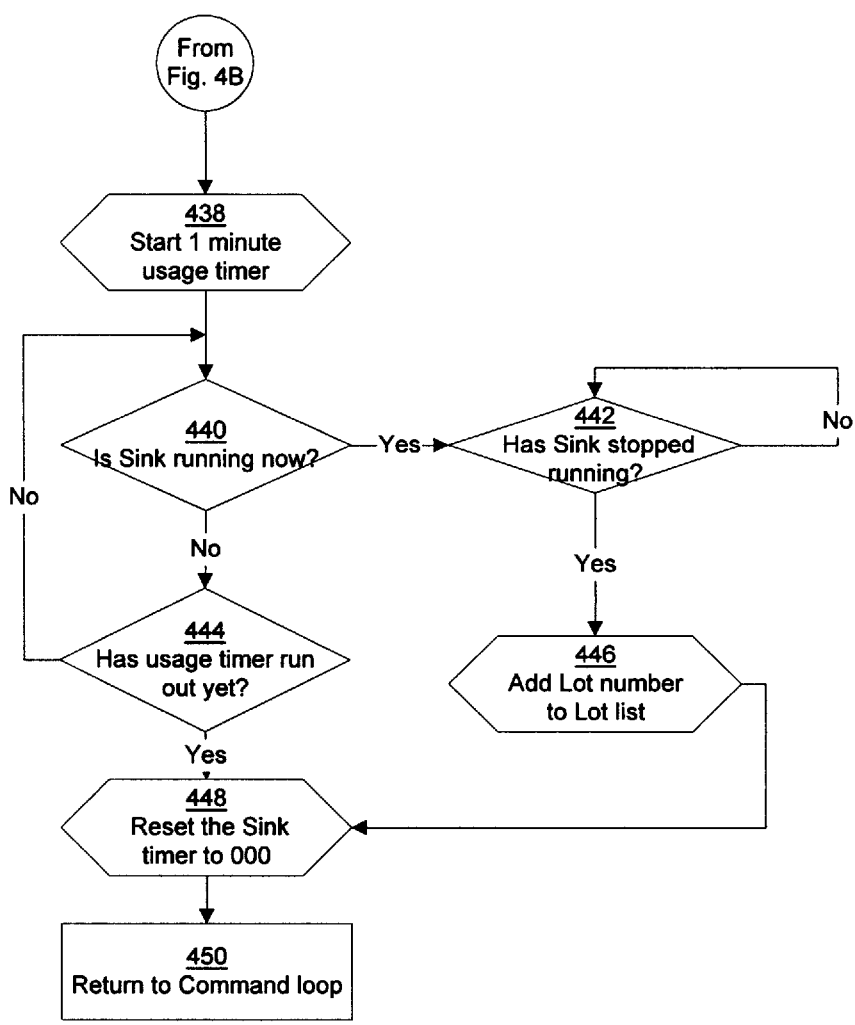

Referring to FIGS. 4A–4C, the lot list mode of operation is set forth. More specifically, referring to FIG. 4A, the lot list mode of operation starts at start step 402 which awaits receipt of a bar-code value.

When a lot list bar-code value is received by workstation controller 150, then control transitions to decision step 408. During decision step 408, workstation controller 150 determines whether the semiconductor manufacturing controller 190 has sent any information to workstation controller 150.

If semiconductor manufacturing controller 190 has provided information, such as set point status information or alarm information, to workstation controller 150, then this information is stored in workstation controller 150 and an acknowledgment signal is provided to semiconductor manufacturing controller 190 to acknowledge receipt of the information. After the receipt of the information is acknowledged, control transitions to 412 to decision step 408 to await further information from semiconductor manufacturing controller 190. This loop repeats until all information from semiconductor manufacturing controller 190 has been received by workstation controller 150. When all information from semiconductor manufacturing controller 190 has been received, as indicated by an empty buffer within manufacturing controller 190, then control transitions to decision step 412. During decision step 412, workstation controller 150 waits until a second bar code value is received from bar code scanner 130. The first bar code value indicates a lot number of the semiconductor material; the second bar code value indicates the time interval for which the lot of semiconductor material to be processed.

After the second bar code value is received, control transitions to decision step 414. During decision step 414, workstation controller 150 determines whether the lot number indicated by the first bar code value is already present within a the list stored in memory 165 of workstation controller 150. The presence of the lot number in the list is an indication that this lot of material has already been processed by semiconductor manufacturing controller 190. Accordingly, reprocessing would be an error, so control returns to decision step 408 and thereby resets the process. An operator display is provided on LCD display 151 to indicate that reprocessing would be an error.

If the lot number is not present in the lot list, control transition to processing section 416. During processing step 416, workstation controller 150 parses the time value indicated by the second bar code value and determines whether the time value is valid. If the time value is invalid, then control transitions to decision step 406 and the operation is reset. An operator display is provided on LCD display 151 to indicate that the value is invalid.

If the time value is valid, then control transitions to processing step 420. During processing step 420, workstation controller 150 enables communication with the semiconductor manufacturing controller 190 by enabling the COM line connected between workstation controller 150 and semiconductor manufacturing controller 190. After the communication is enabled, control transitions to processing step 422 (See FIG. 4B).

Referring to FIG. 4B, during processing step 422, workstation controller 150 sets the time units for semiconductor manufacturing controller 190 (e.g., minutes or seconds). After the time units are set, control transitions to decision step 424. Decision step 424 determine whether the semiconductor manufacturing controller 190 has acknowledged the setting of the time units. If not, the process returns to processing section 422 and again tries to set the sink time units. If the manufacturing controller 190 did acknowledge the setting of the time units, control transitions to processing step 428. During processing step 428, workstation controller 150 sets the time value associated with the time unit and transition to decision step 430. During decision step 430, workstation controller 150 determines whether semiconductor manufacturing controller 190 acknowledged the setting of the time value. If not, then control returns to processing section 422 and restarts the entire time setting process.

If the setting of the time value was acknowledged by the sink, then control transitions to processing section 432. During processing step 432, workstation controller 150 requests the actual time from the semiconductor manufacturing controller 190. Control then transitions to decision step 434, where workstation controller 150 awaits receipt of the time value from the semiconductor manufacturing controller 190. When the time value is returned by the semiconductor manufacturing controller 190, control transitions to decision step 436. During decision step 436, workstation controller 150 determines whether the time value that was returned by semiconductor manufacturing controller 190 was the same time value that was provided by workstation controller 150 to semiconductor manufacturing controller 190. If the time value provided by semiconductor manufacturing controller 190 is not the same value as the time value provided by workstation controller 150, control transitions to processing step 428 via connector 426 to resend the time value to the semiconductor manufacturing controller 190. If the time value returned by the semiconductor manufacturing controller 190 is the same value as the time value provided to the semiconductor manufacturing controller 190, control transitions to processing step 438 (See FIG. 4C).

Referring to FIG. 4C, during processing step 438, the workstation controller 150 starts a one minute watchdog timer. After the watchdog time is started, control transitions to decision step 440. During decision step 440, workstation controller 150 determines whether the semiconductor manufacturing controller 190 is currently processing. If the semiconductor manufacturing controller 190 is currently operating, then control transitions to decision step 442. During decision step 442, workstation controller 150 awaits an indication from semiconductor manufacturing controller 190 that the processing step is complete. When the step is complete, control transitions to processing step 446. During processing step 446, workstation controller 150 adds the lot number of the processed lot of material to the lot list which is stored within memory 165. After the lot number is added to the lot list, control transitions to processing step 448. During processing step 448, the timer of semiconductor manufacturing controller 190 is reset to zero. After the timer is reset, then the present lot list mode of operation is completed and control transitions to termination step 450, in which control returns to read data step 201 (See FIG. 2).

If the semiconductor manufacturing controller 190 is not operating, the workstation controller 150 loops through decision steps 440 and 444 until the watchdog timer completes. If the watchdog timer completes, without the timed semiconductor manufacturing controller 190 starting, then control transitions to processing step 448 which resets the manufacturing controller 190 timer to zero. Accordingly, processing step 448 prevents mistaken misprocessing of subsequent lots of material. After the timer is reset, then the present lot list mode of operation is completed and control transitions to termination step 450, from which control returns to read data step 201 (See FIG. 2).

Figure 5A:
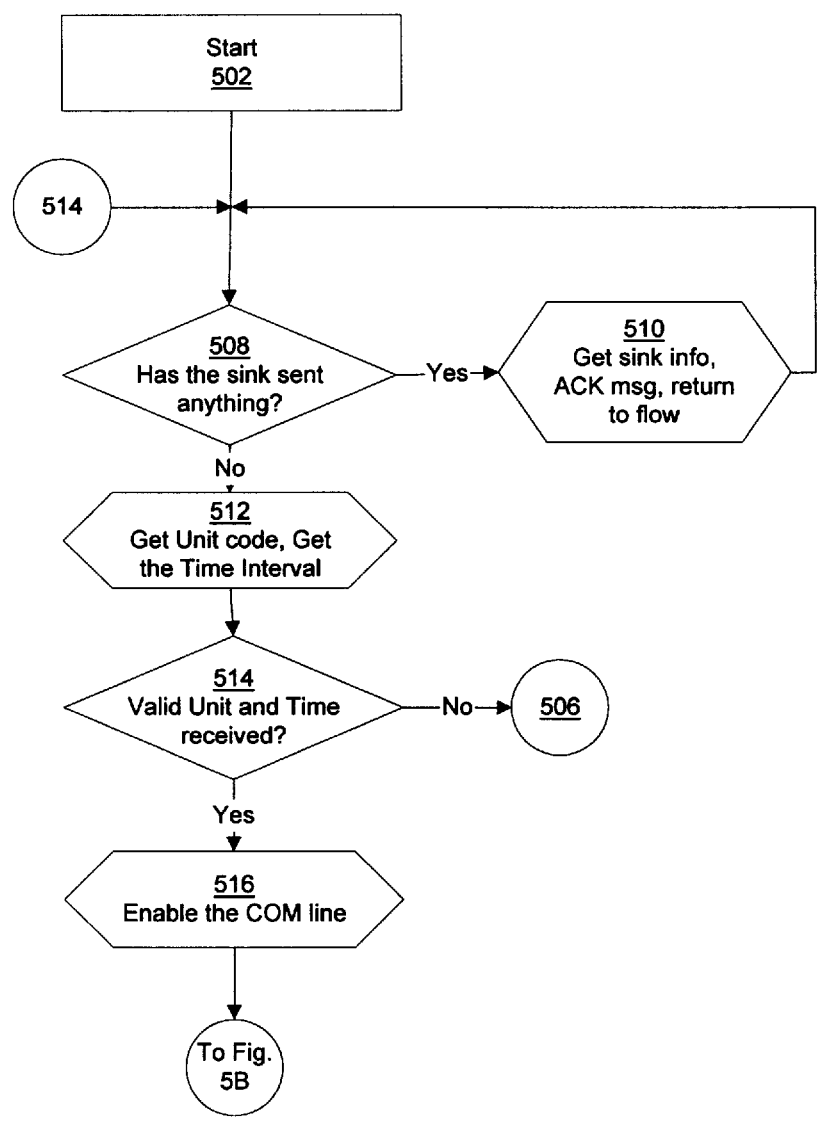
FIGS. 5A–5C are flow charts showing the operation of the manufacturing controller system of FIG. 1 while in a no lot mode of operation.
Figure 5B:
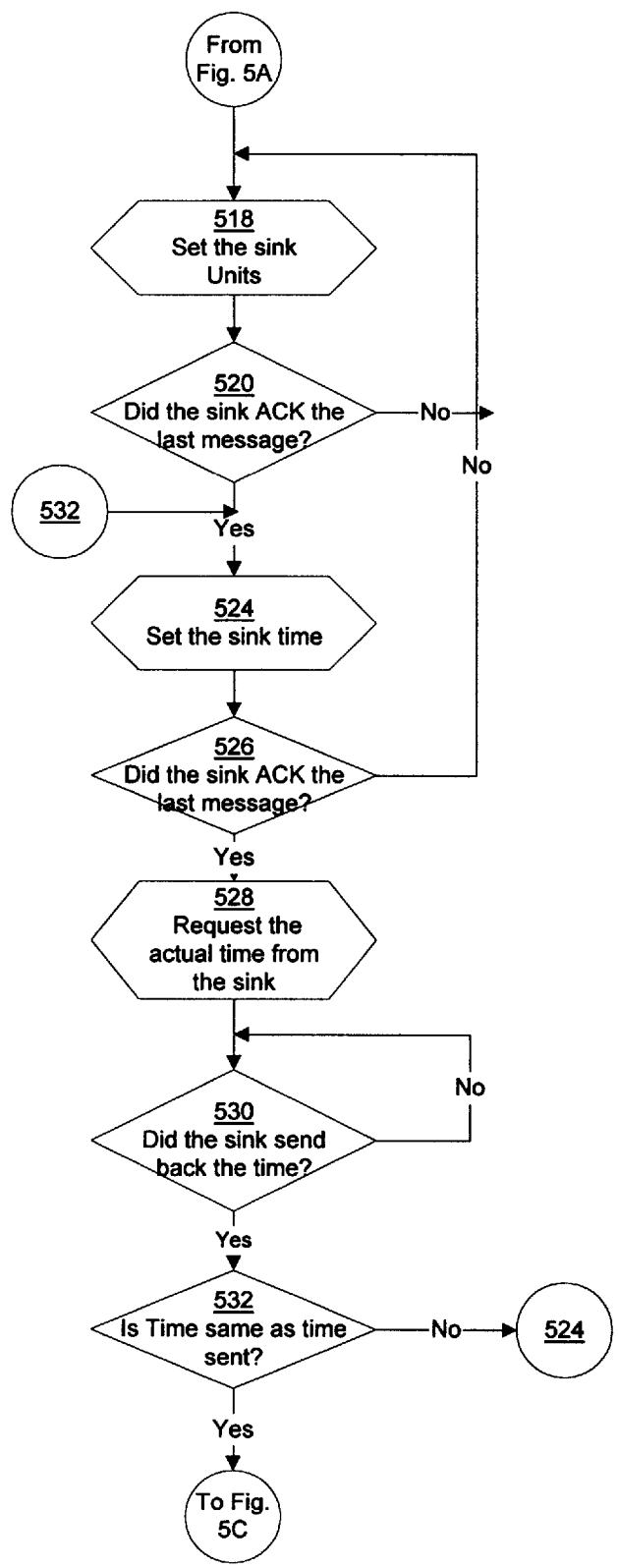
Figure 5C:
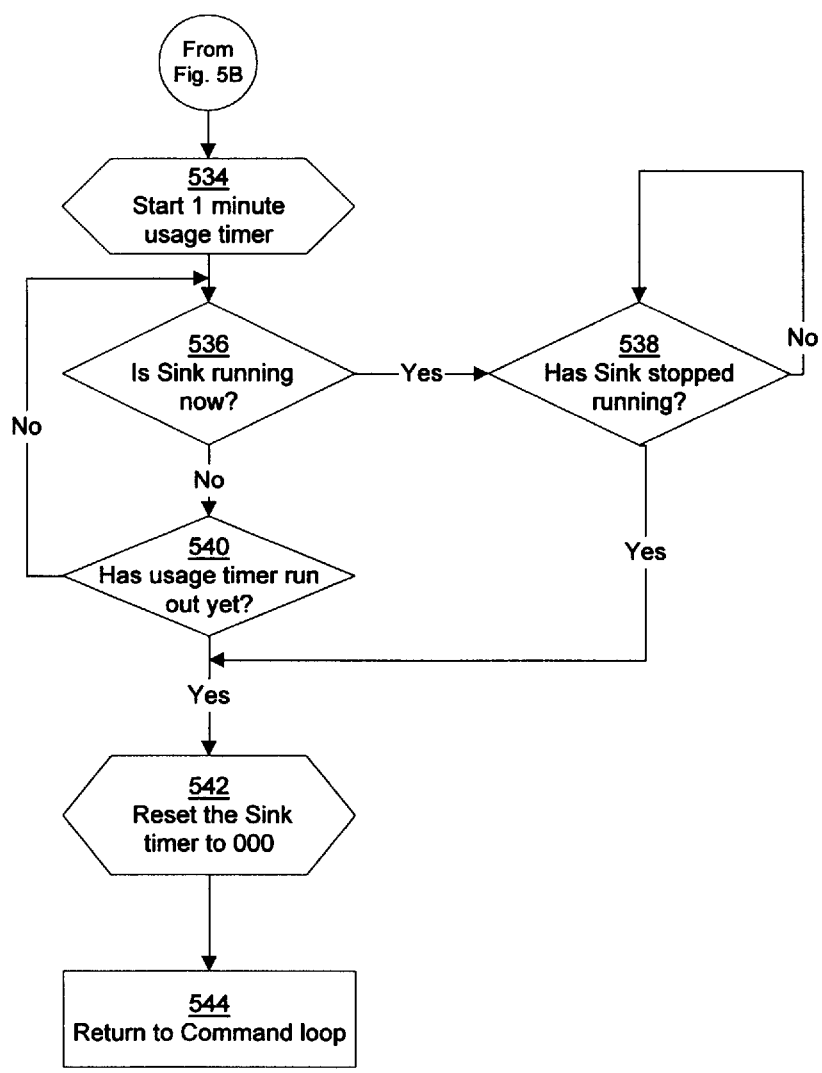

Referring to FIGS. 5A–5C, the no lot list mode of operation is set forth. More specifically, referring to FIG. 5A, the no lot list mode of operation starts at start step 502 which awaits receipt of a bar code value.

When a no lot list bar code value is received by workstation controller 150, then control transitions to decision step 508. During decision step 508, workstation controller 150 determines whether the semiconductor manufacturing controller 190 has sent any information to workstation controller 150. If semiconductor manufacturing controller 190 has provided information to workstation controller 150, then this information is stored in workstation controller 150 and an acknowledgment signal is provided to semiconductor manufacturing controller 190 to acknowledge receipt of the information After the receipt of the information is acknowledged, control transitions to bar code receipt step 508. As a bar code information has been received at this point, the control immediately transitions to decision step 508 to await further information from semiconductor manufacturing controller 190. This loop repeats until all information from semiconductor manufacturing controller 190 has been received by workstation controller 150. When all information from semiconductor manufacturing controller 190 has been received, as indicated by an empty buffer within manufacturing controller 190, then control transitions to processing step 512.

During processing step 512, workstation controller 150 parses the time value indicated obtained during processing step 512 and determines whether the time value is valid. If the time value is invalid, the control transitions to decision step 506 and workstation controller 150 resets the process.

If the time value is valid, then control transitions to processing step 516. During processing step 516, workstation controller 150 enables communication with the semiconductor manufacturing controller 190 by enabling the COM line connected between workstation controller 150 and semiconductor manufacturing controller 190. After the communication is enabled, control transitions to processing step 518 (See FIG. 5B).

Referring to FIG. 5B, during processing step 518, workstation controller 150 sets the time units for semiconductor manufacturing controller 190 (e.g., minutes or seconds). After the time units are set, control transitions to decision step 520. During decision step 520 workstation controller 150 determines whether the semiconductor manufacturing controller 190 has acknowledged the setting of the time units. If not, control transitions to processing step 518 and workstation controller 150 again tries to set the sink time units. If the manufacturing controller 190 did acknowledge the setting of the time units, control transitions to processing step 524. During processing step 524, workstation controller 150 sets the time value associated with the time unit and transitions to decision step 526. During decision step 526, workstation controller 150 determines whether semiconductor manufacturing controller 190 acknowledged the setting of the time value. If not, then control transitions to processing step 518 and workstation controller 150 restarts the time setting process.

If the setting of the time value was acknowledged by the manufacturing controller 190, then control transitions to processing step 528. During processing step 528, workstation controller 150 requests the actual processing time from the semiconductor manufacturing controller 190. Control then transitions to decision step 530, where workstation controller 150 awaits receipt of the time value from the semiconductor manufacturing controller 190. When the time value is returned by the semiconductor manufacturing controller 190, control transitions to decision step 532. During decision step 532, workstation controller 150 determines whether the time value that was returned by semiconductor manufacturing controller 190 was the same time value that was provided by workstation controller 150 to semiconductor manufacturing controller 190. If the time value provided by semiconductor manufacturing controller 190 is not the same value as the time value provided by workstation controller 150, control transitions to processing step 428 and workstation controller 150 resends the time value to the semiconductor manufacturing controller 190. If the time value returned by the semiconductor manufacturing controller 190 is the same value as the time value provided to the semiconductor manufacturing controller 190, control transitions to processing step 534 (See FIG. 5C).

Referring to FIG. 5C, during processing step 534, the workstation controller 150 starts a one minute watchdog timer. After the watchdog time is started, control transitions to decision step 536. During decision step 536, workstation controller 150 determines whether the semiconductor manufacturing controller 190 is currently operating. If the semiconductor manufacturing controller 190 is currently operating, then control transitions to decision step 540.

During decision step 540, workstation controller 150 awaits an indication from semiconductor manufacturing controller 190 that the processing step is complete. When the step is complete, control transitions to processing step 542. During processing step 542, the timer of semiconductor manufacturing controller 190 is reset to zero. After the timer is reset, then the present no lot list mode of operation is completed and control transitions to termination step 544, in which control returns to read data step 201 (See FIG. 2).

If the semiconductor manufacturing controller 190 is not operating, then workstation controller 150 loops through decision steps 536 and 540 until the watchdog timer completes. If the watchdog timer completes without the timed semiconductor manufacturing controller 190 starting, then control transitions to processing step 542 which resets the manufacturing workstation controller 150 timer to zero. Accordingly, processing step 542 prevents mistaken misprocessing of subsequent lots of material. After the timer is reset, then the present no lot list mode of operation is completed and control transitions to termination step 450, from which control returns to read data step 201 (See FIG. 2).

Figure 6:
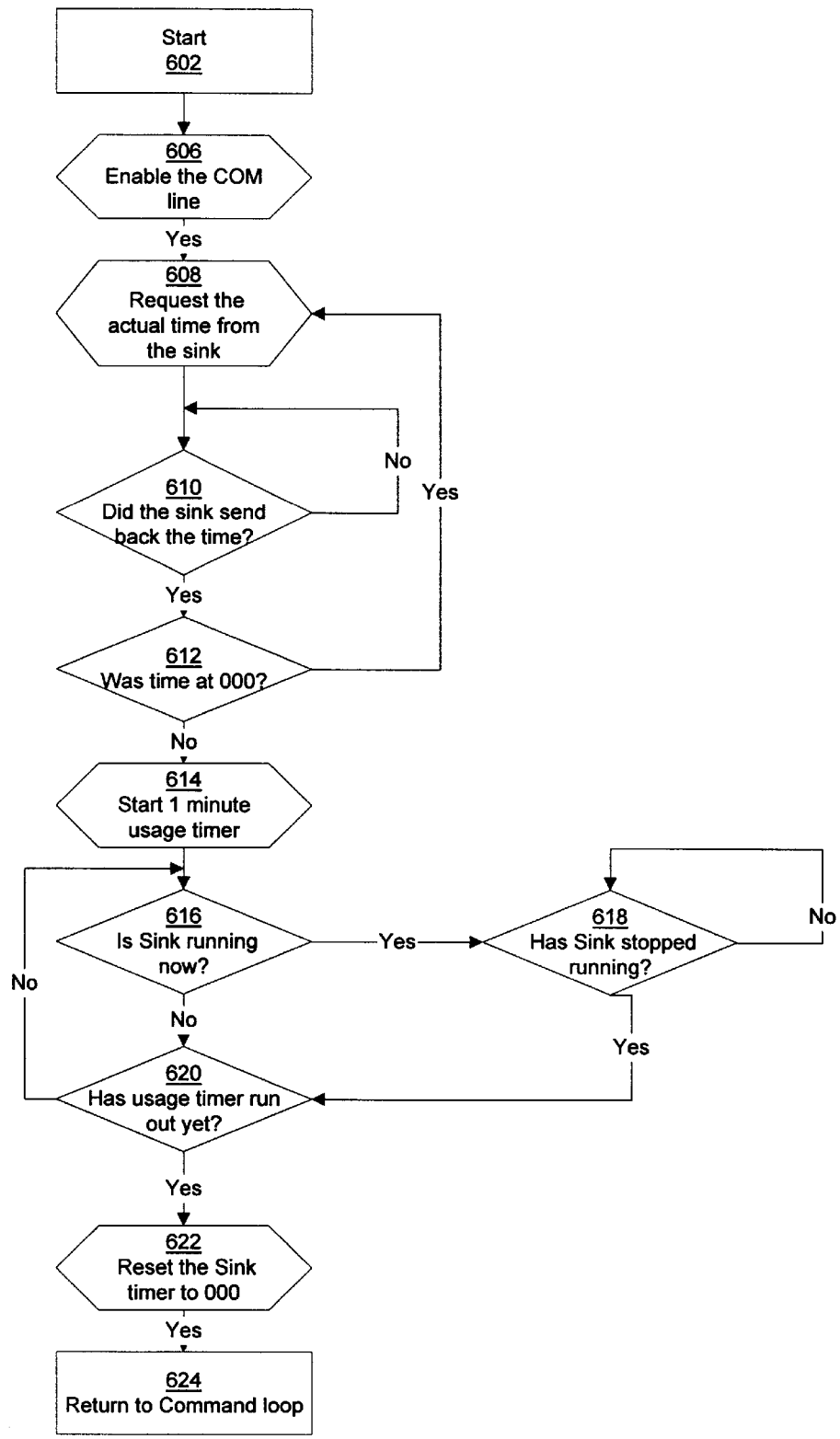
FIG. 6 is a flow chart showing the operation of the manufacturing controller system of FIG. 1 while in a watch mode of operation.

Referring to FIG. 6, controller system starts operation and transitions control to processing step 606. During processing step 606, workstation controller 150 enables communication with the semiconductor manufacturing controller 190 by enabling the COM line connected between workstation controller 150 and semiconductor manufacturing controller 190. After the communication is enabled, control transitions to processing step 618.

During processing step 608, workstation controller 150 requests the actual processing time from semiconductor manufacturing controller 190. Control then transitions to decision step 610. During decision step 610, workstation controller 150 determines whether manufacturing controller 190 has provided the time value to workstation controller 150. If not, control loops within decision step 610 until the time value is provided to workstation controller 150. After manufacturing controller 190 provides workstation controller 150 with the time control transitions to decision step 612. During decision step 612, workstation controller 150 determines whether the time value was zero. If the time value was zero, then control transitions to processing step 608 and workstation controller 150 requests the actual time value that is set within manufacturing controller 140. If the time value was not zero, then control transitions to processing step 614.

During processing step 614, the workstation controller 150 starts a one minute watchdog timer. After the watchdog time is started, control transitions to decision step 616. During decision step 616, workstation controller 150 determines whether the semiconductor manufacturing controller 190 is currently operating. If the semiconductor manufacturing controller 190 is currently operating, then control transitions to decision step 618. During decision step 618, workstation controller 150 awaits an indication from semiconductor manufacturing controller 190 that the processing step is complete. When the step is complete, control transitions to processing step 622. During processing step 622, the timer of semiconductor manufacturing controller 190 is reset to zero. After the timer is reset, then the present watch mode of operation is completed and control transitions to termination step 624, in which control returns to read data step 201 (See FIG. 2).

If the semiconductor manufacturing controller 190 is not operating, then workstation controller 150 loops through decision steps 616 and 620 until the watchdog timer completes. If the watchdog timer completes without the timed semiconductor manufacturing controller 190 starting, then control transitions to processing step 622 which resets the manufacturing controller 190 timer to zero. Accordingly, processing step 622 prevents mistaken misprocessing of subsequent lots of material. After the timer is reset, then the present watch mode of operation is completed and control transitions to termination step 624, from which control returns to read data step 201 (See FIG. 2).

The foregoing description of the invention has been directed to a particular embodiment for purposes of explanation and illustration. However, it will be apparent to those skilled in this art that many modifications and changes may be made without departing from the essence of the invention. It is the Applicant's intent in the following claims to cover all equivalent modifications and variations as fall within the scope of the invention.

Figure 7:
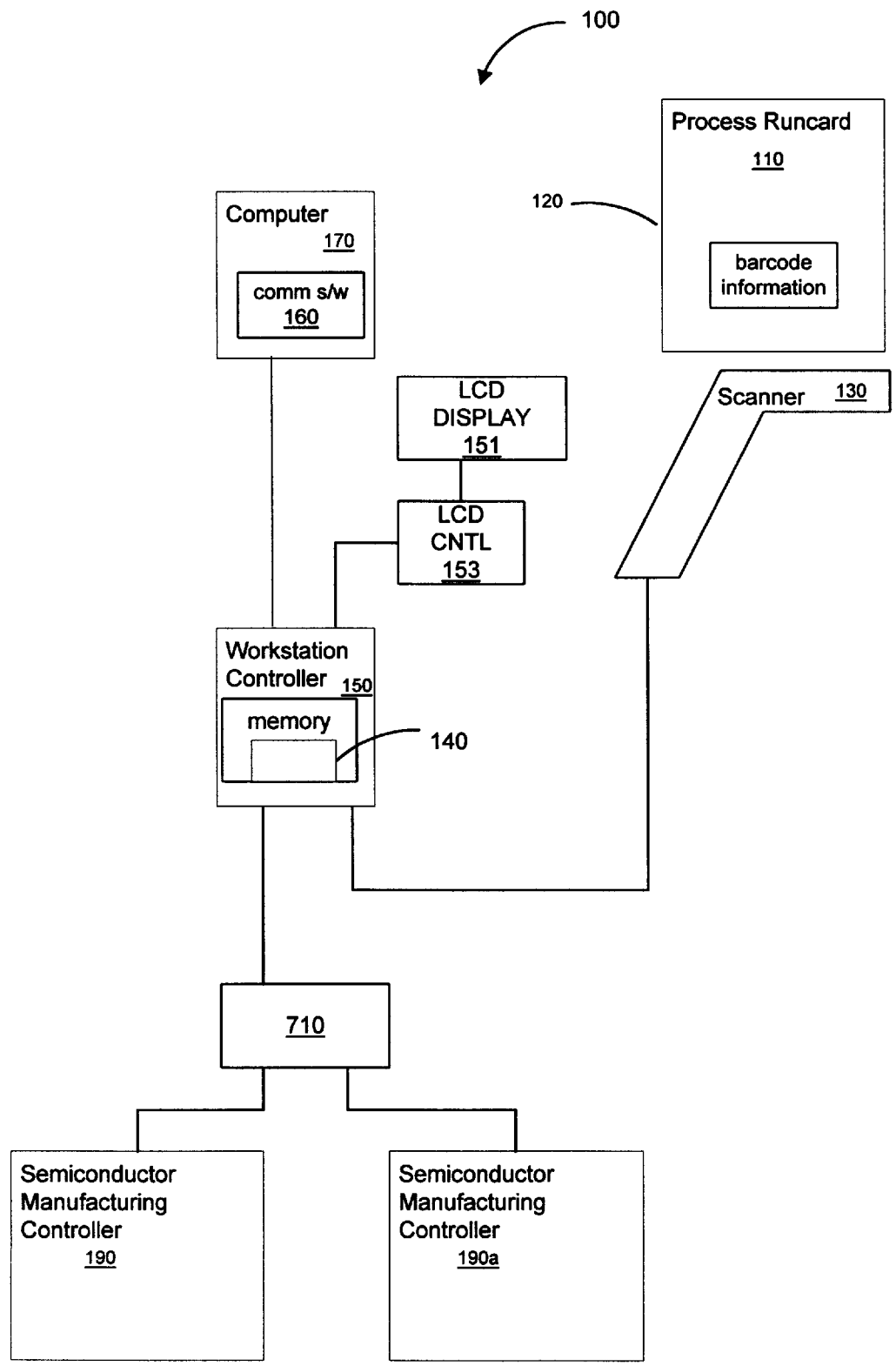
FIG. 7 is a flow chart showing an alternate embodiment of the invention.

For example, in an alternate embodiment, as shown in FIG. 7, manufacturing system 100 may include a plurality of manufacturing controllers. In this embodiment, with each mode of operation, before the time value is provided to the manufacturing controller 190, 190a, the time value is reviewed to determine which manufacturing controller should receive the time value. The appropriate controller 190, 190a is then selected via selector 710.

What is claimed is:

1. A method for controlling a semiconductor manufacturing process, the semiconductor manufacturing process processing semiconductor material, comprising associating the semiconductor material with bar-code information, the bar-code information including information relating to manufacturing process parameters;

scanning the bar-code information prior to initiating a manufacturing process step;

decoding the bar-code information to provide process step parameters; and configuring a controller according to the process step parameters wherein the bar-code information includes a data bar-code relating to encoded data and a command bar-code relating to commands for the individual step.

2. A method for controlling a semiconductor manufacturing process, the semiconductor manufacturing process processing semiconductor material, comprising associating the semiconductor material with bar-code information, the bar-code information including information relating to manufacturing process parameters;

scanning the bar-code information prior to initiating a manufacturing process step;

decoding the bar-code information to provide process step parameters; and configuring a controller according to the process step parameters wherein the bar-code information includes time bar-code relating to a time value indicating the duration of the manufacturing process.

3. The method of claim 2 wherein the bar-code information an identifier bar-code relating to a unique identifier for the associated lot of semiconductor material.

4. A method for controlling a semiconductor manufacturing process, the semiconductor manufacturing process processing semiconductor material, comprising associating the semiconductor material with bar-code information, the bar-code information including information relating to manufacturing process parameters;

scanning the bar-code information prior to initiating a manufacturing process step;

decoding the bar-code information to provide process step parameters; and configuring a controller according to the process step parameters wherein the bar-code information includes a command bar-code relating to a command to change the mode of operation of the semiconductor controller system.

5. An apparatus for controlling a semiconductor manufacturing process, the semiconductor manufacturing process processing semiconductor material, the apparatus comprising a workstation controller, the workstation controller being coupled to a manufacturing controller;

means for associating the semiconductor material with bar-code information, the bar-code information including information relating to manufacturing process parameters;

a bar-code scanner coupled to the workstation controller, the bar-code scanner being controlled by the workstation controller to scan the bar-code information prior to initiating a manufacturing process step;

means for decoding the bar-code information to provide process step parameters; and means for configuring the manufacturing controller according to the process step parameters, wherein the bar-code information includes a data bar-code relating to encoded data and a command bar-code relating to commands for the individual step.

6. An apparatus for controlling a semiconductor manufacturing process, the semiconductor manufacturing process processing semiconductor material, the apparatus comprising a workstation controller, the workstation controller being coupled to a manufacturing controller;

means for associating the semiconductor material with bar-code information, the bar-code information including information relating to manufacturing process parameters;

a bar-code scanner coupled to the workstation controller, the bar-code scanner being controlled by the workstation controller to scan the bar-code information prior to initiating a manufacturing process step;

means for decoding the bar-code information to provide process step parameters; and means for configuring the manufacturing controller according to the process step parameters, wherein the bar-code information includes time bar-code relating to a time value indicating the duration of the manufacturing process.

7. The apparatus of claim 6 wherein the bar-code information includes an identifier bar-code relating to a unique identifier for the associated lot of semiconductor material.

8. An apparatus for controlling a semiconductor manufacturing process, the semiconductor manufacturing process processing semiconductor material, the apparatus comprising a workstation controller, the workstation controller being coupled to a manufacturing controller;

means for associating the semiconductor material with bar-code information, the bar-code information including information relating to manufacturing process parameters;

a bar-code scanner coupled to the workstation controller, the bar-code scanner being controlled by the workstation controller to scan the bar-code information prior to initiating a manufacturing process step;

means for decoding the bar-code information to provide process step parameters; and means for configuring the manufacturing controller according to the process step parameters, wherein the bar-code information includes a command bar-code relating to a command to change the mode of operation of the semiconductor controller system.

9. An article of manufacture comprising a computer readable, non-volatile memory means for associating a semiconductor material with bar-code information, the bar-code information including information relating to manufacturing process parameters, the means for associating being stored on the memory;

means for decoding the bar-code information to provide process step parameters, the means for decoding being stored on the memory; and means for configuring a controller according to the process step parameters, the means for configuring being stored on the memory wherein the bar-code information includes a data bar-code relating to encoded data and a command bar-code relating to commands for the individual step.

10. An article of manufacture comprising a computer readable, non-volatile memory means for associating a semiconductor material with bar-code information, the bar-code information including information relating to manufacturing process parameters, the means for associating being stored on the memory;

means for decoding the bar-code information to provide process step parameters, the means for decoding being stored on the memory; and means for configuring a controller according to the process step parameters, the means for configuring being stored on the memory wherein the bar-code information includes time bar-code relating to a time value indicating the duration of the manufacturing process.

11. The article of manufacture of claim 10 wherein the bar-code information includes an identifier bar-code relating to a unique identifier for the associated lot of semiconductor material.

12. An article of manufacture comprising a computer readable, non-volatile memory means for associating a semiconductor material with bar-code information, the bar-code information including information relating to manufacturing process parameters, the means for associating being stored on the memory;

means for decoding the bar-code information to provide process step parameters, the means for decoding being stored on the memory; and means for configuring a controller according to the process step parameters, the means for configuring being stored on the memory wherein the bar-code information includes a command bar-code relating to a command to change the mode of operation of the semiconductor controller system.

* * * * *